United States Patent [19]
Inada et al.

[11] Patent Number: 5,608,559
[45] Date of Patent: Mar. 4, 1997

[54] DISPLAY BOARD HAVING WIRING WITH THREE-LAYERED STRUCTURE AND A DISPLAY DEVICE INCLUDING THE DISPLAY BOARD

[75] Inventors: Kiyoshi Inada, Jyouyou; Motoji Shiota, Kashihara; Hirokazu Yoshida, Osaka; Yasunobu Tagusa, Ikoma, all of Japan

[73] Assignee: Sharp Kabushiki Kaisha, Osaka, Japan

[21] Appl. No.: 350,406

[22] Filed: Dec. 6, 1994

[30] Foreign Application Priority Data

Dec. 7, 1993 [JP] Japan ................................. 5-306672
May 31, 1994 [JP] Japan ................................. 6-118044

[51] Int. Cl.$^6$ ............................. G02F 1/1343; H05K 1/09
[52] U.S. Cl. ........................... 349/149; 174/251; 174/257
[58] Field of Search .................... 359/87, 88; 257/749; 174/251, 257

[56] References Cited

U.S. PATENT DOCUMENTS

| | | | |
|---|---|---|---|
| 4,922,323 | 5/1990 | Potter | 357/71 |
| 5,146,301 | 9/1992 | Yamamura et al. | 257/57 |
| 5,187,604 | 2/1993 | Taniguchi et al. | 359/87 |
| 5,223,965 | 6/1993 | Ota et al. | 359/88 |
| 5,270,848 | 12/1993 | Takabayashi et al. | 359/88 |
| 5,467,210 | 2/1994 | Kishigami | 359/88 |
| 5,510,918 | 5/1994 | Matsunaga et al. | 359/87 |
| 5,526,563 | 3/1995 | Tamaki et al. | 359/88 |

FOREIGN PATENT DOCUMENTS

| | | | |
|---|---|---|---|
| 63-58319 | 3/1988 | Japan | 359/88 |
| 63-195687 | 8/1988 | Japan . | |
| 64-019324 | 1/1989 | Japan . | |
| 1-102433 | 4/1989 | Japan . | |
| 4-19710 | 1/1992 | Japan | 359/88 |
| 4-43327 | 2/1992 | Japan | 359/88 |
| 4-153623 | 5/1992 | Japan | 359/88 |

OTHER PUBLICATIONS

English–language abstract of JP–A–64–019324 publication of Jan. 23, 1989, Yoshino/Toshiba, based on Japanese application no. 62–174747, Jul. 15, 1987.

*Primary Examiner*—William L. Sikes
*Assistant Examiner*—Tiep H. Nguyen
*Attorney, Agent, or Firm*—David G. Conlin; Milton Oliver

[57] ABSTRACT

A display board has wirings on a surface thereof for transmitting a signal received from outside at a peripheral portion of the display board to a display area of the display board. Each wiring has a first conductive film formed of a first material and disposed on the surface of the display board, a second conductive film which is formed of a second material satisfying a condition that a surface of the second conductive film is less prone to oxidation than a surface of the first conductive film and which is disposed on a part of the first conductive film, and a transparent conductive film which is an oxide film and which is disposed on at least the second conductive film. Those first conductive film, second conductive film and transparent film constitute a three-layered structure portion of the wiring.

20 Claims, 9 Drawing Sheets

DISPLAY BOARD HAVING WIRING WITH THREE-LAYERED STRUCTURE AND A DISPLAY DEVICE INCLUDING THE DISPLAY BOARD

BACKGROUND OF THE INVENTION

1. Field of the Invention

The present invention relates to a display board and an assembly structure of the display board and particularly to a display board constituting part of a display panel for a liquid crystal display device, EL (electroluminescence) display device and other display devices, and an assembly structure of the display board.

2. Description of the Prior Art

Figure 1:
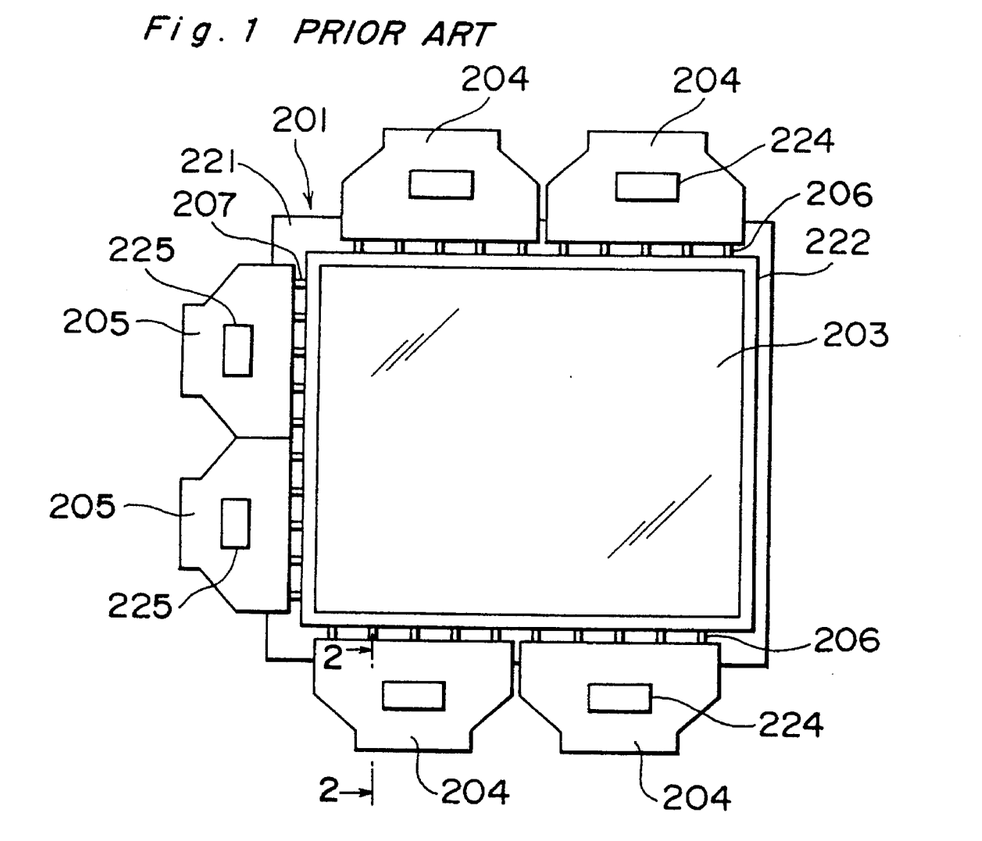
FIG. 1 is a general plan view of a conventional liquid crystal display device assembled by a common assembling method.
Figure 2:
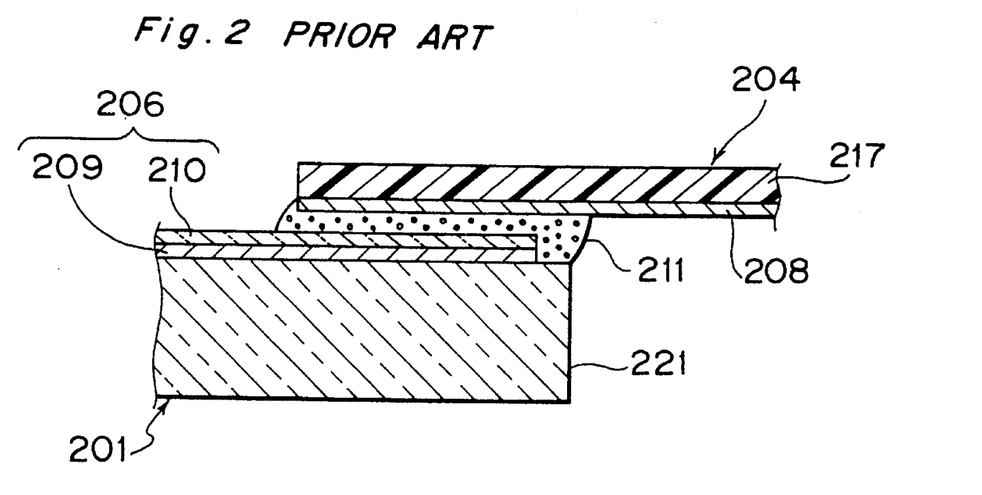
FIG. 2 is a sectional view taken along a line 2—2 in FIG. 1.

FIG. 1 shows a matrix type liquid crystal display device assembled in accordance with a common assembling method (drive IC assembling method). An LCD panel 201 is constructed by sealing up liquid crystals (not shown) between a lower substrate 221 and an upper substrate 222 which constitute a display board. Peripheral portions of the lower substrate 221 are provided with a lot of wirings 206, 207 extending outwardly from a display area 203 containing pixels toward edges thereof. End portions of the wirings 206, 207 on the board edge side serve as electrode terminals (for simplicity, the electrode terminals are assumed to be included in the wirings throughout the present specification). FIG. 2 is a sectional view taken along a line 2—2 in FIG. 1. As shown in FIG. 2, the wiring 206 of the lower substrate 221 has, for example, a two-layered structure composed of a film 209 made of Ta (tantalum) having a thickness of about 3000 Å and a film 210 made of ITO (indium tin oxide) having a thickness of about 800 Å provided on the Ta film (see, for example, Japanese Laid-Open Patent Application No. SHO 63-195687). As shown in FIG. 1, a flexible wiring board 204, 205 mounted with a drive IC 224, 225 is connected to each wiring 206, 207 of the lower substrate 221 in an assembled condition. In more detail, as shown in FIG. 2, the flexible wiring board 204 has output terminals 208 made of Cu plated with Sn, Au, or the like on its base film, i.e., substrate 217 made of polyimide resin. The terminal portion of the wiring 206 of the lower substrate 221 is connected with the output terminal 208 of the flexible wiring board 204 via a connection material 211 having a conductivity. In operation, a display signal output from the drive IC 224 is supplied to the display area via the output terminal 208 of the flexible wiring board 204, the connection material 211, and the wiring 206 of the lower substrate 221.

Figure 3:
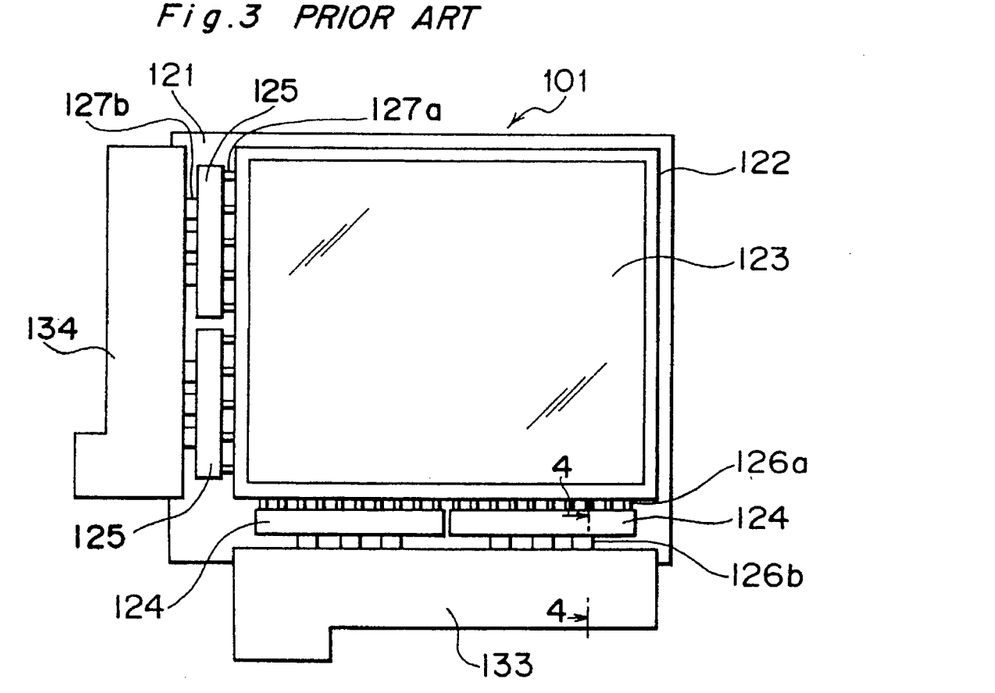
FIG. 3 is a general plan view of a conventional liquid crystal display device assembled by a COG method.
Figure 4:
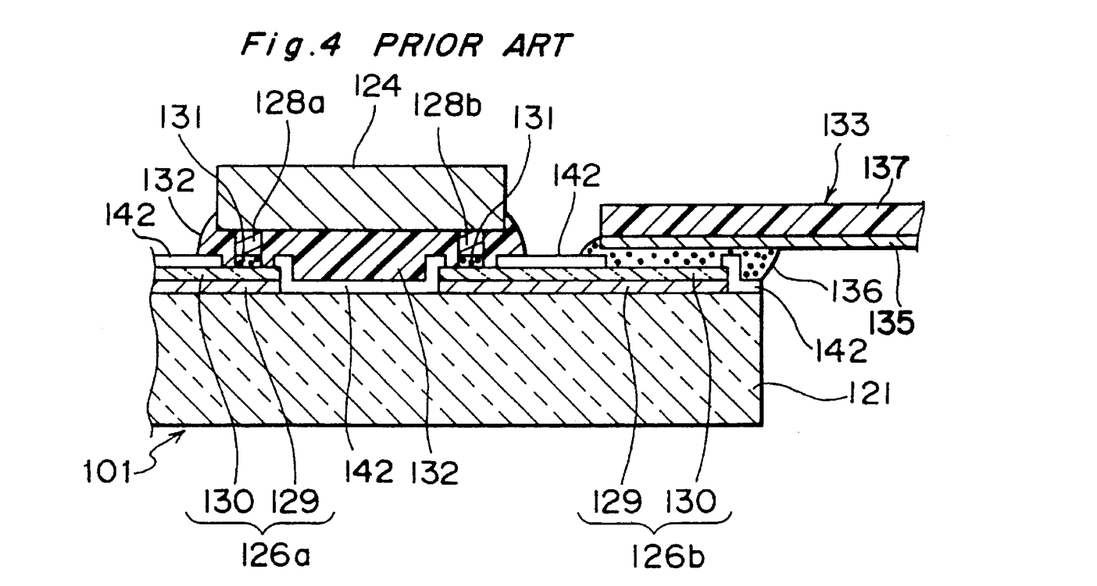
FIG. 4 is a sectional view taken along a line in FIG. 3.

FIG. 3 shows an existing matrix type liquid crystal display device assembled in accordance with the COG (Chip On Glass) method. An LCD panel 101 is constructed by sealing liquid crystals (not shown) between a lower substrate 121 and an upper substrate 122 which constitute a display board. Peripheral portions of the lower substrate 121 are provided with a lot of wirings 126a and 126b; 127a and 127b extending outwardly from a display area 123 with pixels. Edge-side end portions of the wirings 126a and 126b; 127a and 127b serve as electrode terminals. On the board periphery side of the wirings 126a, 127a are provided further wirings 126b, 127b separated from the wirings 126a, 127a. These wirings 126b, 127b extend toward the edges of the board. FIG. 4 is a sectional view taken along a line 4—4 of FIG. 3. As shown in FIG. 4, the wirings 126a and the wirings 126b of the lower substrate 121 each have a two-layered structure composed of a Ta film 129 having a thickness of about 3000 Å and an ITO film 130 having a thickness of about 800 Å provided on the Ta film 129. As shown in FIG. 3, in the assembled state, a drive IC 124, 125 is mounted on the lower substrate 121 between the wirings 126a, 127a, and the wirings 126b, 127b and a flexible wiring board 133, 134 is connected to the wirings 126b. In more detail, as shown in FIG. 4, the drive IC 124 has an output-side bump electrode 128a and an input-side bump electrode 128b. The output-side bump electrode 128a and the input-side bump electrode 128b are connected respectively to the wiring 126a and the wiring 126b of the lower substrate 121 via a connection material 131 having a conductivity. Meanwhile, the flexible wiring board 133 has output terminals 135 made of Cu plated with Sn, Au, or the like on a surface of its substrate 137 made of polyimide resin. The output terminals 135 are connected with the terminal portions of the wirings 126b of the lower substrate 121 via a connection material 136 having a conductivity. In operation, a power and an input signal are supplied to the drive IC 124 via the output terminals 135 of the flexible wiring board 133, the connection material 136, the wirings 126b, the connection material 131, and the input side bump electrodes 128b. Then a display signal output from the drive IC 124 is supplied to the display area via the output side bump electrodes 128a, the connection material 131, and the wirings 126a.

In either of the aforementioned liquid crystal display devices, the wirings 206, 207 (shown in FIGS. 1 and 2) and the wirings 126a and 126b; 127a and 127b (shown in FIGS. 3 and 4) have the two-layered structure composed of the Ta film (a lower film) and the ITO film (an upper film). Since the sheet resistivity of the Ta film is about 3 $\Omega/\square$ and the sheet resistivity of the ITO film is about 50 $\Omega/\square$, the supply of the power and signal from the board periphery to the display area is performed mainly through the Ta film, i.e., the lower layer. In the two-layered structure, due to the existence of the ITO film on the Ta film, the surface of the Ta film can be prevented from being oxidized after completion of the board.

However, in the wirings 206, 207 (shown in FIGS. 1 and 2) and the wirings 126a and 126b; 127a and 127b (shown in FIGS. 3 and 4) having the two-layered structure composed of the Ta film and the ITO film, the surface of the lower layer, the Ta film, is oxidized during formation of the ITO film. Furthermore, when reworking is performed in the process of patterning the ITO film, the Ta film is corroded by an etchant (ferric chloride solution) for the ITO film and changes in quality. Therefore, a resistivity at the interface between the ITO film and the Ta film varies significantly, resulting in reduction of yield. According to an experiment, the resistivity at the interface between the ITO film and the Ta film ranges from about $2 \times 10^4$ to $10^7$ $\Omega \cdot \mu m^2$ due to fluctuation factors in the board fabrication process. When the surface of the Ta film is oxidized and changes in quality and the resistivity at the interface between the Ta film and the ITO film increases, the resistivity of from the drive IC to the display area increases and the display signal is therefore distorted, resulting in deteriorating the image display qualities. This problem becomes serious when the wirings 206, 207 (shown in FIGS. 1 and 2) and the wirings 126a and 126b; 127a and 127b (shown in FIGS. 3 and 4) are reduced in area according as the image display is made finer. For instance, the area of the wiring 126a is far smaller in the COG assembling system than that in the common assembling system (drive IC assembling system). Therefore, the resistivity increases greatly and this great increase in resistivity results to exert a significant influence on the image display qualities. Meanwhile, although the wiring 126b has an area greater than that of the wiring 126a, the increase in resistivity of the line for supplying the power is fatal even though the increase is small, which significantly degrades the operation conditions of the drive IC.

SUMMARY OF THE INVENTION

The object of the present invention is therefore to provide a display board and an assembly structure of the display board, i.e., display device, which can be produced without being affected by the change in the process and which offer high yield and good display quality.

In order to achieve the above object, the present invention provides a display board which has wirings on a surface thereof for transmitting a signal received from outside at a peripheral portion of the display board to a display area of the display board, wherein each wiring comprises:

- a first conductive film formed of a first material and disposed on the surface of the display board;
- a second conductive film which is formed of a second material satisfying a condition that a surface of the second conductive film is less prone to oxidation than a surface of the first conductive film .and which is disposed on a part of the first conductive film; and
- a transparent conductive film which is an oxide film and which is disposed on at least the second conductive film,
- the first conductive film, second conductive film and transparent film constituting a three-layered structure portion of the wiring.

In the display board with the above construction, because the transparent conductive film is not directly formed on the first conductive film, and the second conductive film is formed between the first conductive film and the transparent conductive film, the surface of the first conductive film is not corroded in the process of forming the transparent conductive film, unlike the conventional examples. Furthermore, since the second conductive film is less prone to oxidation than the first conductive film, the degree of oxidation of the second conductive film in the process of forming the transparent conductive film is lighter than the degree of oxidation of the surface of the first conductive film in the process of forming the transparent conductive film in the conventional examples. Thus, according to the present invention, the oxidation of the surface of the first conductive film and the surface of the second conductive film can be suppressed.

Furthermore, with the above-mentioned arrangement, the interfacial resistivity at the interface between the first conductive film and the second conductive film and the interfacial resistivity at the interface between the second conductive film and the transparent conductive film are less susceptible to the influence of the change in the process and becomes low and stable, in comparison with the conventional examples. Therefore, the display board is produced with high yield and assures a good display quality after the assembly process. The display board can also cope with a future attempt at making the image display finer.

In an embodiment of the present invention, portions of the wirings, inclusive of the three-layered structure portion, other than an end portion serving as an electrode terminal are covered with an insulating protection film. At the end portion of each wiring, the transparent conductive film is formed on the first conductive film. In other word, the insulating protection film covering the wirings has an opening portion to expose the end portion of each wiring and the three-layered structure portion is not located under the opening portion of the insulating protection film. With this arrangement, in forming the opening portion of the insulating protection film by etching, the second conductive film can be prevented from being corroded by an etchant. Thus, the second conductive film is prevented from disappearing due to the etchant. Therefore, the first conductive film beneath the second conductive film can be prevented from being exposed. More specifically, the first conductive film which is more prone to oxidation than the second conductive film can be prevented from being exposed. Therefore, the surface of the first conductive film is prevented from being oxidized and therefore the electric resistance of the wiring is prevented from increasing.

As a result, the display board having the insulating protection film on the wirings can be produced with high yield, and a good display quality is assured after the assembly process.

In an embodiment, the second conductive film surrounds the transparent conductive film formed on the first conductive film at the end portion of each wiring. In this case, an electrical current can be conducted from the second conductive film around the transparent conductive film to the transparent conductive film surrounded by the second conductive film, and vice versa, via multiple different paths.

As the first material, Ta (titanium) or an alloy whose main constituent is Ta can be used, and as the second material, Ti (titanium) or an alloy whose main constituent is Ti can be used. Alternatively, the first material and first material can be selected from a group consisting of Al or an alloy whose main constituent is Al, Mo or an alloy whose main constituent is Mo, Cr or an alloy whose main constituent is Cr, W or an alloy whose main constituent is W, and Au or an alloy whose main constituent is Au.

On the other hand, the transparent conductive film can be made of indium tin oxide (ITO).

When the first conductive film is a Ta film, the second conductive film is a Ti film, and the transparent conductive film is an ITO film, the surface of the Ta film is not oxidized in the process of forming the Ti film on the Ta film to form the wiring. Furthermore, the degree of oxidation of the surface of the Ti film in the process of forming the ITO film on the Ti film is much lower than the degree of oxidation of the surface of the Ta film in the process of forming the ITO film on the Ta film. Furthermore, the Ti film is not corroded by the etchant (ferric chloride solution) for the ITO film. Therefore, the interfacial resistivity at the interface between the Ta film and the Ti film and the interfacial resistivity at the interface between the Ti film and the ITO film are less susceptible to the influence of a change in the process and become low and stable, in comparison with the conventional case. Therefore, the display board is produced with high yield and assures a good display quality after the assembly process. The display board can also cope with a future attempt at making the image display finer.

In a display device including the above display board, the wirings are connected with output terminals of a flexible wiring board mounted with a drive circuit for generating a signal to be transmitted to the display area. In this display device, the resistance (including a resistance at the terminal portion) relevant to the wiring which extends from the output terminal of the flexible wiring board to the display area is in a low and stable condition in comparison with the conventional case, due to the low interfacial resistivity between the Ta film and the Ti film and between the Ti film and the ITO film. Therefore, a good display quality can be obtained.

In a display device, the wirings include first wirings extending outside from the display area toward a periphery of the display board and second wirings provided on a board periphery side of the first wirings and extending toward the periphery of the display board. In this case, a drive circuit for generating a signal to be transmitted to the display area is provided between the first wirings and the second wirings of the display board, input-side electrodes of the drive circuit are connected with display-area-side end portions of the second wirings and output-side electrodes of the drive circuit are connected with board-periphery-side end portions of the first wirings, and output terminals of a flexible wiring board for supplying a signal to the drive circuit are connected with board-periphery-side end portions of the second wirings. In this display device, the resistance (including a resistance at the terminal portion) relevant to the second wiring which extends from the output terminal of the flexible wiring board to the input-side terminal of the drive circuit and the resistance (including a resistance at the terminal portion) relevant to the first wiring which extends from the output-side terminal of the drive circuit to the display area are in a low and stable condition in comparison with the conventional case, due to the low interfacial resistivity between the films of the wirings. Therefore, a good display quality can be obtained.

If the transparent conductive film of each of the first and second wirings is an indium tin oxide film, the indium tin oxide film of each of the first and second wirings is connected to the corresponding electrode of the drive circuit by an anisotropic conductive film. In this case, the lower surface of the drive circuit or drive IC (chip) is protected by the anisotropic conductive film. Therefore, a high reliability can be achieved without applying a resin coat for sealing the drive IC.

In another embodiment, an Mo (molybdenum) film is formed at a board-periphery-side end portion of each first wiring and at a display-area-side end portion of each second wiring. In this case, the contact resistances of the wirings with the output-side electrode and the input side-electrode (generally made of Au) of the drive IC are further reduced due to presence of the molybdenum film. Therefore, the resistance (including a resistance at the terminal portion) relevant to the second wiring which extends from the output terminal of the flexible wiring board to the input-side electrode of the drive circuit and the resistance (including a resistance at the terminal portion) relevant to the first wiring which extends from the output-side electrode of the drive circuit to the display area are further reduced. Therefore, a good display quality can be achieved, and the reliability of the connection increases.

When the Mo film of each of the first and second wirings are connected with the corresponding electrode of the drive circuit by a paste including either Ag or an alloy of Ag and Pd (palladium) as conductive particles, the contact resistance between each wiring and the corresponding electrode of the drive circuit are further reduced. Therefore, the resistances (including resistances at the terminal portions) relevant to the first and second wirings are further reduced. Therefore, a good display quality can be achieved, and the reliability of the connection increases.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 5:
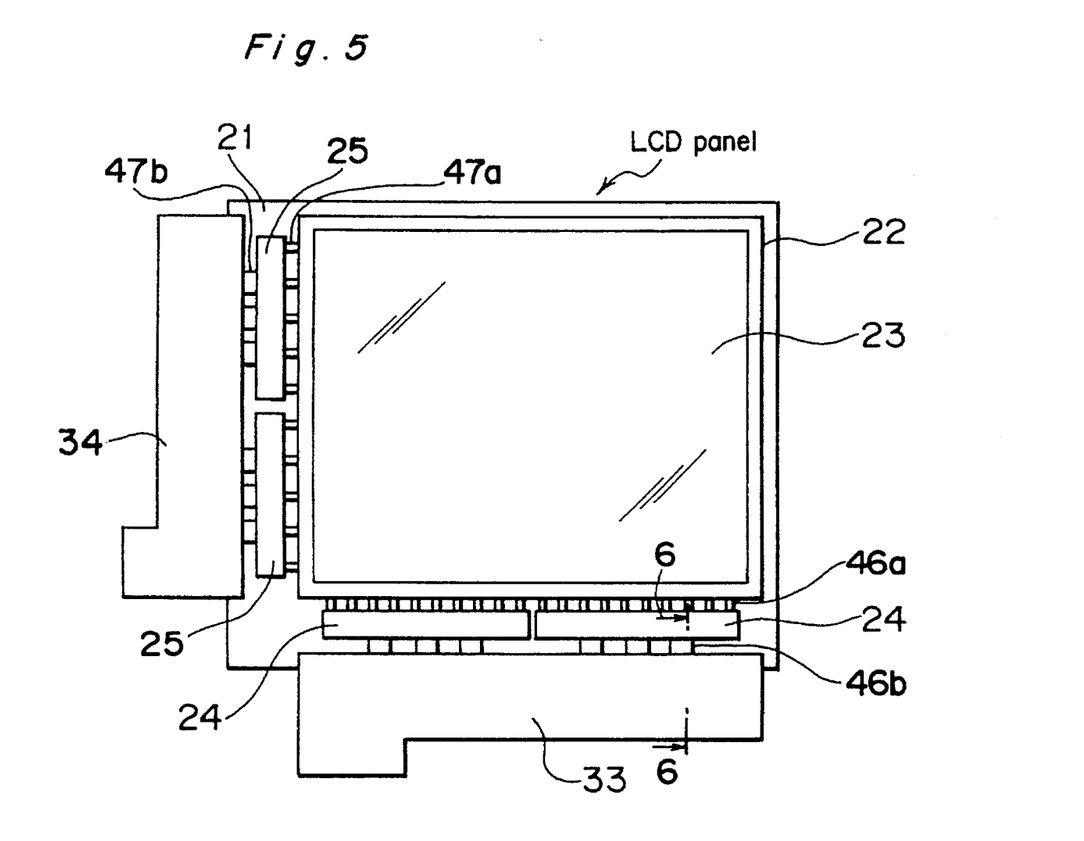
FIG. 5 is a schematic plan view of a liquid crystal display device including a display board in accordance with a first embodiment of the present invention.
Figure 6:
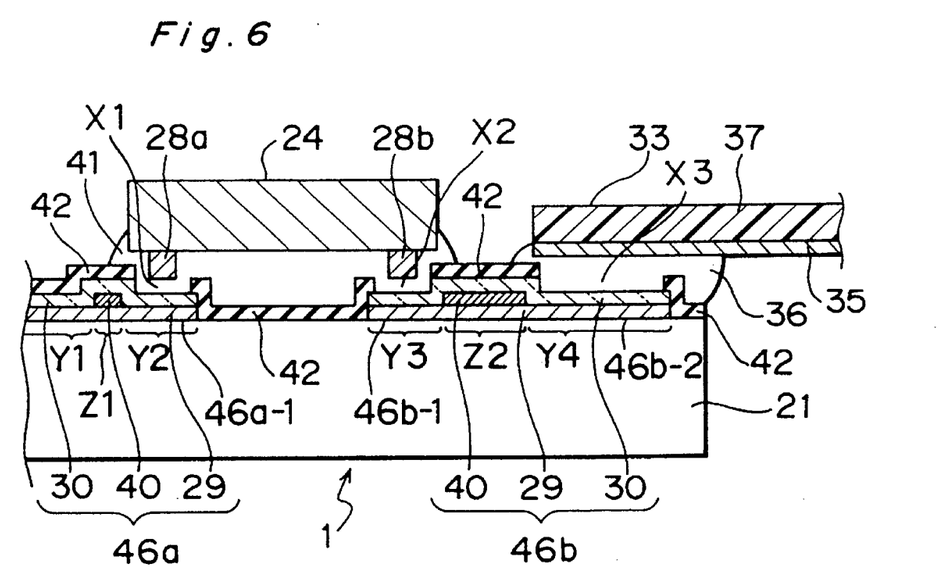
FIG. 6 is a sectional view taken along a line 6—6 in FIG. 5.

FIG. 5 shows a schematic plan view of a liquid crystal display device assembled in accordance with the COG (Chip On Glass) method, and FIG. 6 shows a sectional view of essential parts of the device, wherein some parts are not hatched for the sake of simplicity. This liquid crystal display device is provided with an LCD panel 1, drive ICs 24, 25 and flexible wiring boards 33, 34.

The LCD panel 1 is provided with a lower substrate 21 being a display board in accordance with a first embodiment of the present invention, an upper substrate 22, and liquid crystals sealedly interposed between the lower substrate 21 and the upper substrate 22.

Figure 7:
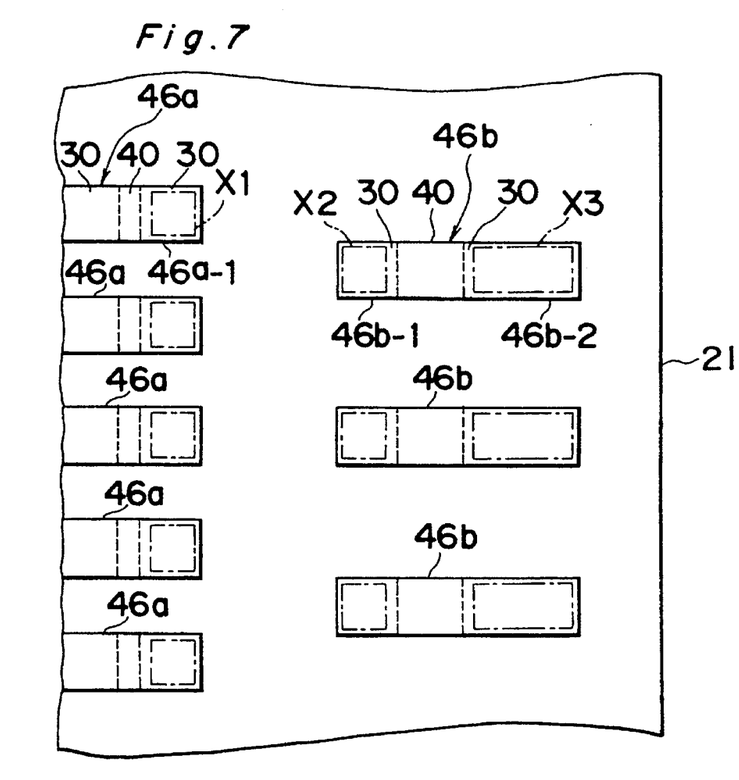
FIG. 7 is a fragmentary plan view of a lower substrate of the first embodiment display board, showing planar configurations of wirings on the lower substrate.

As shown in FIGS. 5–7, the lower substrate 21 is provided with a plurality of first wirings 46a, 47a, a plurality of second wirings 46b, 47b and an SiN film 42 which serves as an insulating protection film.

The following will describe the wirings 46a, 46b in detail. However, it will be easily understood that the following description holds true with the wirings 47a, 47b.

On the lower substrate 21, the first wirings 46a extend outward from a display area 23 where pixels are formed toward its peripheral portion. A terminal portion 46a-1 of each of the first wirings 46a serves as an electrode terminal. The second wirings 46b are provided on the board-periphery side of the first wirings 46a separately from the first wirings 46a and extend toward the periphery or edges of the substrate 21. The SiN film 42 which serves as an insulating protection film is formed on the wirings 46a and 46b and has a thickness of about 3000 Å. The SiN film 42 is provided with opening portions X1, X2, and X3 in positions opposite to the terminal portions 46a-1, 46b-1, and 46b-2 of the wirings 46a and 46b. The SiN film 42 covers approximately the entire area of the wirings 46a and 46b except for the regions opposite to the opening portions X1, X2, and X3.

Each of the first wirings 46a and the second wirings 46b has a Ta (tantalum) film 29 formed on the lower substrate 21 as a first conductive film, a Ti (titanium) film 40 formed on the Ta film 29 as a second conductive film, and an ITO film 30 formed on the Ta film 29 and the Ti film 40 as a transparent conductive film. The Ta film 29, Ti film 40, and ITO film 30 constitute three-layered structure portions Z1 and Z2, while the Ta film 29 and the ITO film 30 formed directly on the Ta film 29 constitute two-layered structure portions Y1, Y2, Y3, and Y4. The three-layered structure portions Z1 and Z2 are not opposite to the opening portions X1, X2, and X3 of the SiN film 42. The two-layered structure portions Y2, Y3, and Y4 are opposite to the opening portions X1, X2, and X3 of the SiN film 42. The thickness of the Ta film 29 is about 3000 Å, the thickness of the Ti film 40 is about 3000 Å, and the thickness of the ITO film 30 is about 800 Å. The sheet resistivity of the Ta film is about 3 $\Omega/\square$, the sheet resistivity of the ITO film is about 50 $\Omega/\square$, and the sheet resistivity of the Ti film is about 3 $\Omega/\square$.

The first wiring 46a and the second wiring 46b of the lower substrate 21 of the first embodiment have the aforementioned three-layered structure portions Z1 and Z2. In producing the three-layered structure portions, firstly the Ti film 40 is formed on the Ta film 29, and thereafter the ITO film 30 is formed on the Ti film 40. In other words, the ITO film 30 is not formed directly on the Ta film 29. Accordingly, the surface of the Ta film 29 included in the three-layered structure portions Z1 and Z2 is not oxidized. Since the Ti film 40 is less prone to oxidation than the Ta film 29, the degree of oxidation of the surface of the Ti film 40 due to the formation of the ITO film 30 on the Ti film 40 is far lower than the degree of oxidation of the surface of the Ta film 29 due to the formation of the ITO film 30 on the Ta film 29. Furthermore, the Ti film 40 is not corroded by an etchant (ferric chloride solution) used to etch the ITO film 30.

Therefore, the resistivity at the interface between the Ta film 29 and the Ti film 40 and the resistivity at the interface between the Ti film 40 and the ITO film 30 are less susceptible to the change in the process in comparison with the conventional case. As a result, those interfacial resistivities are low and stable. Therefore, according to the present embodiment, good display quality can be obtained. Furthermore, the LCD panel 1 can be produced with high yield and is able to cope with a finer image display.

The Ti film 40 is not provided in the regions opposite to the opening portions X1, X2, and X3 of the SiN film 42. Therefore, the Ti film 40 is not etched by an etchant (buffer hydrofluoric acid) used in patterning the SiN film 42. If the Ti film 40 is provided in the regions opposite to the opening portions X1, X2, and X3, the etchant (buffer hydrofluoric acid) will penetrate the ITO film 30 having a small film thickness and corrode the Ti film 40 below. The above results in the Ti film 40 being etched and disappearing together with the ITO film 30 above. As a result, only the Ta film 29 which is prone to oxidation remains at the terminal portions 46a-1, 46b-1, 46b-2, and the surface of the Ta film 29 becomes significantly unstable. By using a dry etching method with SiF$_4$ (silicon tetrafluoride) plasma for the etching of the SiN film 42, the possible disappearance of the Ti film 40 and the ITO film 30 due to the etching can be prevented. For the dry etching, however, there arises a problem that a large initial investment is required.

According to the present embodiment, because the Ti film 40 is not provided in the regions opposite to the opening portions X1, X2, and X3, it is possible to avoid the disappearance of the Ti film 40 by the etchant for the SiN film 42, without requiring a large initial investment. Therefore, the Ta film 29 beneath the Ti film 40, which is more prone to oxidation than the Ti film 40, can be prevented from being exposed. Therefore, it is possible to prevent the surface of the Ta film 29 from being oxidized and thus prevent the electric resistances of the first wirings 46a and the second wirings 46b from increasing. Therefore, according to the present embodiment, the LCD panel 1 can be produced with high yield without a large initial investment for the dry etching. Furthermore, the present embodiment can cope with a future attempt at making the image display finer.

The drive IC 24 has output-side bump electrodes 28a and input-side bump electrodes 28b. The bump electrodes 28a and 28b are formed by gold plating. The bump electrodes 28a and 28b are arranged above the opening portions X1 and X2 of the SiN film 42. The flexible wiring board 33 has a base film, i.e., a substrate 37 made of polyimide resin and output terminals 35 which are made of Cu plated with Sn, Au, or the like and formed on a surface of the substrate 37. The output terminals 35 of the flexible wiring board 33 are arranged above the opening portions X3 of the SiN film 42. The drive IC 25 and the flexible wiring board 34 are similar to the drive IC 24 and the flexible wiring board 33, respectively.

In the assembled state shown in FIGS. 5 and 6, the drive IC 24 is mounted on the lower substrate 21 between the first wirings 46a and the second wirings 46b. More specifically, the output-side bump electrodes 28a and the input-side bump electrodes 28b of the drive IC 24 are connected respectively to the board-periphery-side terminal portions 46a-1 of the wirings 46a and the display-area-side terminal portions 46b-1 of the wirings 46b via an anisotropic conductive film 41 which is a connection material. The terminal portions 46a-1 and 46b-1 serve as electrode terminals of the first wirings 46a and the second wirings 46b.

The flexible wiring board 33 is connected to the terminal portions 46b-2 of the wirings 46b. More specifically, the output terminals 35 (only one of which is shown) of the flexible wiring board 33 are connected to the board-periphery-side terminal portions 46b-2 of the second wirings 46b on the lower substrate 21 via an anisotropic conductive film 36 which is a connection material.

The above-mentioned connections are achieved by heating the anisotropic conductive films 41 and 36 with application of a pressure.

In operation, an electric power and an input signal are supplied from each output terminal 35 of the flexible wiring board 33 to the drive IC 24 by way of the anisotropic conductive film 36, the wiring 46b, the anisotropic conductive film 41, and the input-side bump electrode 28b.

A display signal output from the drive IC 24 is supplied to the display area via the output-side bump electrode 28a, the anisotropic conductive film 41, and the wiring 46a.

Since the Ti film 40 is provided in a part of each of the patterns of the wirings 46a and 46b, a resistance (including a resistance at the terminal portion) relevant to the wiring 46b which extends from the output terminal 35 of the flexible wiring board 33 to the input-side bump electrode 28b of the drive IC 24 and a resistance (including a resistance at the terminal portion) relevant to the wiring 46a which extends from the output-side bump electrode 28a of the drive IC 24 to the display area 23 are low and stable in comparison with the conventional case. Therefore, a good display quality can be obtained.

Furthermore, since the lower substrate 21 and the drive IC 24 are connected with each other via the anisotropic conductive film 41, the lower surface of the drive IC (chip) 24 is protected by the anisotropic conductive film 41. This allows a high reliability to be achieved without applying a sealing resin to the drive IC 24.

According to an experiment on the first wiring 46a and second wiring 46b formed in a specific wiring pattern for measurement, the resistivity at the interface between the Ta film 29 and the Ti film 40 was $5 \times 10^2$ to $8 \times 10^2$ $\Omega.m^2$, and the resistivity at the interface between the Ta film 40 and the ITO film 30 was $5 \times 10^2$ to $2 \times 10^3$ $\Omega.m^2$ even when a change takes place in the process. Therefore, the resistivity from the Ta film 29 via the Ti film 40 to the ITO film 30 was estimated to be $1.0 \times 10^3$ to $2.8 \times 10^3$ $\Omega.\mu m^2$ which were the sum of both the resistivity values. That is, in the lower substrate 21 of the display board of the first embodiment, the resistivity of the wiring was able to be incommensurably reduced in comparison with the resistivity value of $2 \times 10^4$–$10^7$ $\Omega.m^2$ of the wiring of the conventional example in which the Ti film 40 is not provided.

The board-periphery-side terminal portion 46b-2 and the display-area-side terminal portion 46b-1 of the second wiring 46b and the board-periphery-side terminal portion 46a-1 of the first wiring 46a are arranged opposite to the opening portion X3, opening portion X2, and opening portion X1 of the SiN film 42, respectively, and serve as the electrode terminals. Each of the terminal portions 46b-2, 46b-1, and 46a-1 serving as the electrode terminals has a two-layered structure composed of the ITO film 30 and the Ta film 29 provided beneath the ITO film 30. Therefore, in the terminal portions 46b-2, 46b-1, and 46a-1, the resistance at the interface between the ITO film 30 and the Ta film 29 varies greatly in comparison with the aforementioned three-layered structure due to the change in the process.

Figure 8:
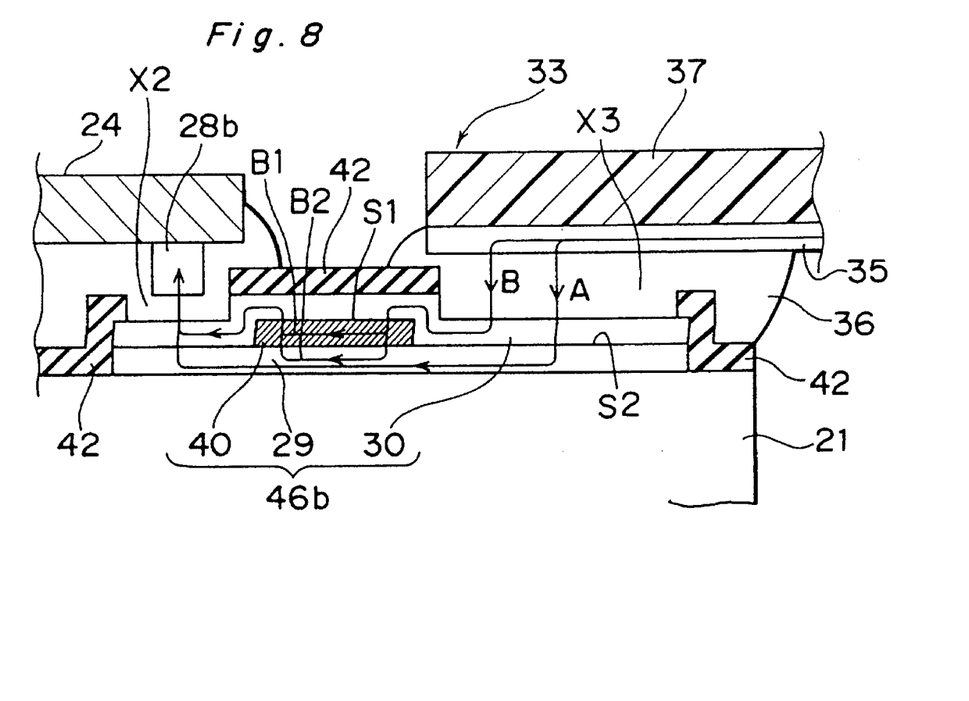
FIG. 8 is an enlarged sectional view of an essential part of FIG. 6.
Figure 9:
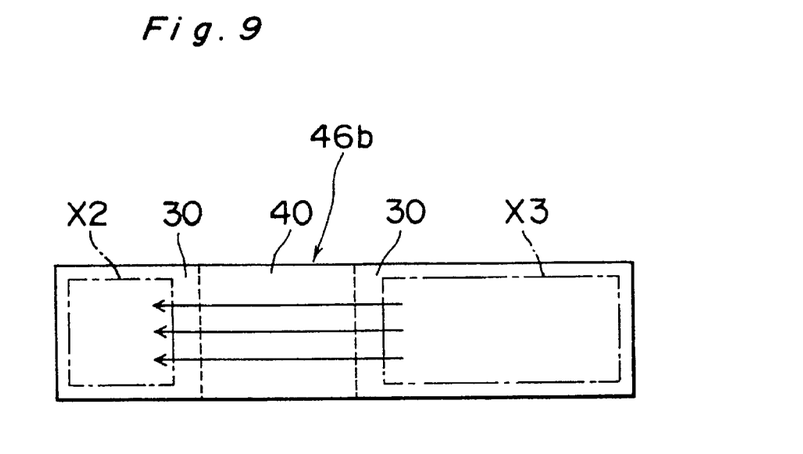
FIG. 9 is a plan view of a second wiring in the first embodiment display board.

The following describes the resistivity reducing function of the first embodiment based on a case where a current flows from the output terminal 35 of the flexible wiring board 33 to the input-side bump electrode 28b of the drive IC 24 via the second wiring 46b with reference to FIGS. 8 and 9. FIG. 8 shows an enlarged sectional view of the second wiring 46b and its vicinities, and FIG. 9 shows a top view of the second wiring 46b. In FIG. 8 hatching to some parts is omitted for the sake of simplicity.

First, a path A shown in FIG. 8 is the path through which a current flows when the resistivity at the interface between the ITO film 30 and the Ta film 29 of the second wiring 46b is made relatively low within a range of variation. In the present case, the current flowing from the output terminal 35 of the flexible wiring board 33 to the ITO film 30 via the anisotropic conductive film 36 passes through the ITO film 30 which has a sheet resistivity higher than that of the Ta film 29. Then, the current passes through an interface S2 between the ITO film 30 and the Ta film 29, and flows in the Ta film 29 which has a lower sheet resistivity. Then the current flowing in the Ta film 29 passes again through the interface S2 between the Ta film 29 and the ITO film 30 below the input-side bump electrode 28b of the drive IC 24, and then through the ITO film 30 into the input-side bump electrode 28b via the anisotropic conductive film 41.

Meanwhile, a path B shown in FIG. 8 is the path through which a current flows when the resistivity at the interface between the ITO film 30 and the Ta film 29 of the second wiring 46b is made relatively high within the range of variation. In the present case, the current flowing from the output terminal 35 of the flexible wiring board 33 to the ITO film 30 via the anisotropic conductive film 36 does not pass through the interface S2 between the ITO film 30 and the Ta film 29 but flows in the ITO film 30 which has a sheet resistivity higher than that of the Ta film 29. Then the current passes through a region of the ITO film 30 opposite to the opening portion X3 of the SiN film 42, and then passes through an interface S1 between the ITO film 30 and the Ti film 40, and then flows in the Ti film 40 which has a sheet resistivity lower than that of the ITO film 30 or in the Ta film 29 beneath the Ti film 40 as indicated by a path B1 or a path B2 in FIG. 8. The reason for the above is that the Ti film 40 has a sheet resistivity lower than that of the ITO film 30, and the resistivity at the interface S1 between the Ti film 40 and the ITO film 30 is lower than the sheet resistivity at the interface S2 between the Ta film 29 and the ITO film 30. It is to be noted that the resistivity at the interface between the Ti film 40 and the Ta film 29 is lower than the resistivity at the interface S1. Then the aforementioned current passes again through the interface S1 between the ITO film 30 and the Ti film 40 at an end of the Ti film 40 on the side of the input-side bump electrode 28b, and flows through the ITO film 30 and then the anisotropic conductive film 41 into the input-side bump electrode 28b.

In the conventional wiring structure which does not include the Ti film 40, the current path is limited to the path A, and therefore the current cannot help passing through the interface S2 between the ITO film 30 and the Ta film 29 having a resistivity higher than that of the interface S1 between the ITO film 30 and the Ti film 40. In contrast, in this first embodiment, the current can flow through the path B, i.e., a bypass route extending through the interface S1 having a resistivity lower than that of the interface S2. Since the first embodiment has the bypass route for the current flow, the second wiring 46b is prevented from having a high resistance and maintained at a low resistance. This is true with the first wiring 46a. Namely, the resistance of the wiring can be maintained at a value lower than that of the conventional example. Therefore, a good display quality can be obtained.

Actually, the resistance (including the resistance at the terminal portion) relevant to the second wiring 46b was 3 to 4 $\Omega$ when the area of the Ti film 40 was $10^4$ $\mu m^2$, which value indicates that the resistance and the variation of the resistance were able to be remarkably reduced in comparison with the wiring without the Ti film wherein the resistance is 5 to 29 $\Omega$.

Second Embodiment

Figure 10:
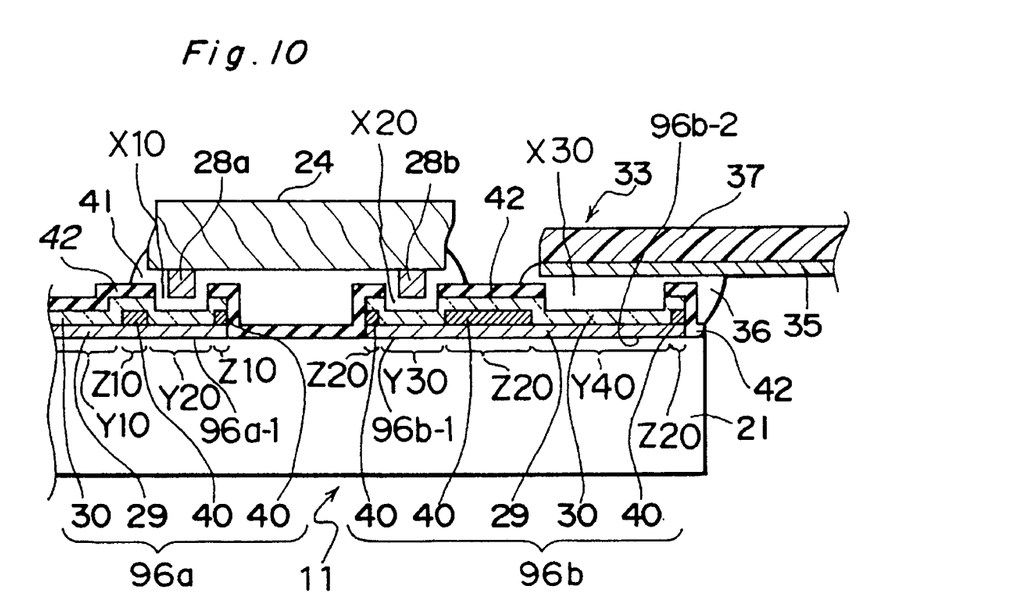
FIG. 10 is a sectional view of essential parts of a liquid crystal display device including a display board in accordance with a second embodiment of the present invention.

A second embodiment of the present invention is described with reference to FIGS. 10–13. In FIGS. 10–13, parts similar to those shown in FIGS. 6–9 are denoted by the same reference numerals. FIG. 10 shows a sectional view of essential parts of a liquid crystal display device assembled in accordance with the COG (Chip On Glass) method. The liquid crystal display device of this embodiment has a schematic plan view substantially the same as that of the first embodiment shown in FIG. 5, so that FIG. 5 is also used to describe the liquid crystal display device of the second embodiment. The present liquid crystal display device is provided with an LCD panel 11, drive ICs 24, 25 and flexible wiring boards 33, 34.

The LCD panel 11 is provided with a lower substrate 21 which is a display board in accordance with the second embodiment of the present invention, an upper substrate (refer to 22 in FIG. 5), and liquid crystals sealedly contained between the lower substrate 21 and the upper substrate.

Figure 11:
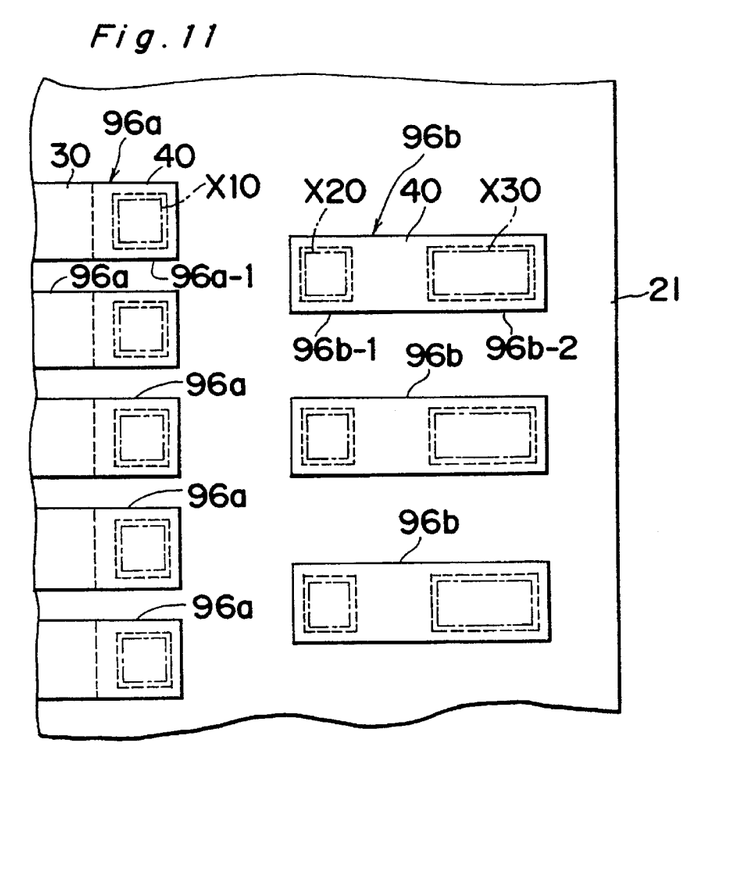
FIG. 11 a fragmentary plan view of a lower substrate of the second embodiment display board, showing planar configurations of wirings on the lower substrate.

As shown in FIGS. 10 and 11, the lower substrate 21 is provided with a plurality of first wirings 96a, a second wiring 96b, and an SiN film 42 which serves as an insulating protection film.

On the lower substrate 21, the first wirings 96a extend outward from a display area (refer to 23 in FIG. 5) where pixels are formed toward its peripheral portion. A terminal portion 96a-1 of each of the first wirings 46a serves as an electrode terminal. The second wirings 96b are provided on the board-periphery side of the first wirings 96a separately from the first wirings 96a and extend toward the periphery or edges of the substrate 21. The SiN film 42 which serves as an insulating protection film is formed on the wirings 96a and 96b and has a thickness of about 3000 Å. The SiN film 42 is provided with opening portions X10, X20, and X30 in positions opposite to the terminal portions 96a-1, 96b-1, and 96b-2 of the wirings 96a and 96b. The SiN film 42 covers approximately the entire area of the wirings 96a and 96b except for the regions opposite to the opening portions X10, X20, and X30.

Each of the first wirings 96a and the second wirings 96b has a Ta film 29 formed on the lower substrate 21 as a first conductive film, a Ti film 40 formed on the Ta film 29 as a second conductive film, and an ITO film 30 formed on the Ta film 29 and the Ti film 40 as a transparent conductive film. The Ta film 29, Ti film 40, and ITO film 30 constitute three-layered structure portions Z10 and Z20 in the regions being not opposite to the opening portions X10, X20, and X30.

The first and second wirings 96a and 96b have two-layered structure portions Y10, Y20, Y30 and Y40 adjacent to the three-layered structure portions Z10 and Z20. The two-layered structure portions Y10 through Y40 are composed of the Ta film 29 and the ITO film 30 formed on the Ta film 29.

Figure 13:
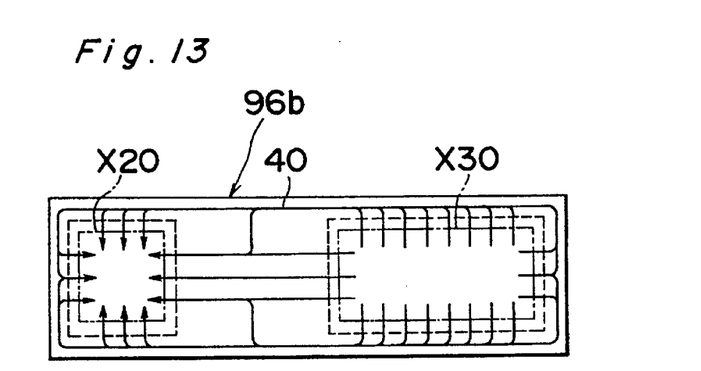
FIG. 13 is a plan view of a second wiring in the second embodiment display board.

Furthermore, in the second embodiment, the Ti film 40 which serves as the second conductive film in the three-layered structure portions Z10 and Z20 is surrounding the ITO film 30 in the two-layered structure portions Y20, Y30, and Y40, as shown in FIG. 13.

The thickness of the Ta film 29 is about 3000 Å, the thickness of the Ti film 40 is about 3000 Å, and the thickness of the ITO film 30 is about 800 Å. The sheet resistivity of the Ta film 29 is about 3 $\Omega/\square$, the sheet resistivity of the ITO film 30 is about 50 $\Omega/\square$, and the sheet resistivity of the Ti film 40 is about 3 $\Omega/\square$.

In the assembled state shown in FIGS. 5 and 10, a drive IC 24 is mounted on the lower substrate 21 between the first wirings 96a and the second wirings 96b. The drive IC 24 has output-side bump electrodes 28a and input-side bump electrodes 28b. The bump electrodes 28a and 28b are formed by gold plating. The bump electrodes 28a and 28b are arranged above the opening portions X10 and X20. The flexible wiring board 33 has a base film or substrate 37 made of polyimide resin and output terminals 35 which are made of a Cu material plated with Sn, Au, or the like and formed on a surface of the substrate 37. The output terminals 35 of the flexible wiring board 33 are arranged above the opening portions X30 of the SiN film 42.

The output-side bump electrode 28a and the input-side bump electrode 28b of the drive IC 24 are connected respectively to the board-periphery-side terminal portion 96a-1 of the first wiring 96a and the display-area-side terminal portion 96b-1 of the second wiring 96b via an anisotropic conductive film 41. This connection is achieved by heating the anisotropic conductive film 41 with application of a pressure. The terminal portions 96a-1 and 96b-1 serve as electrode terminals of the first wiring 96a and the second wiring 96b.

The flexible wiring board 33 is connected to the lower substrate 21. More specifically, the output terminals 35 of the flexible wiring board 33 are connected to the board-periphery-side terminal portions 96b-2 of the second wirings 96b on the lower substrate 21 via an anisotropic conductive film 36. This connection is achieved by heating the anisotropic conductive film 36 with application of a pressure.

In operation, an electric power and an input signal are supplied from the output terminals 35 of the flexible wiring board 33 to the drive IC 24 by way of the anisotropic conductive films 36, the wirings 96b, the anisotropic conductive films 41, and the input-side bump electrodes 28b.

A display signal output from the drive IC 24 is supplied to the display area (see 23 in FIG. 5) via the output-side bump electrode 28a, the anisotropic conductive film 41, and the wiring 96a.

In producing the three-layered structure portions Z10 and Z20 of the first and second wirings 96a and 96b on the lower substrate 21, firstly the Ti film 40 is formed on the Ta film 29, and thereafter the ITO film 30 is formed on the Ti film 40. In other words, the ITO film 30 is not formed directly on the Ta film 29. Accordingly, the surface of the Ta film 29 included in the three-layered structure portions Z10 and Z20 is not oxidized. Since the Ti film 40 is less prone to oxidation than the Ta film 29, the degree of oxidation of the surface of the Ti film 40 due to the formation of the ITO film 30 on the Ti film 40 is far lower than the degree of oxidation of the surface of the Ta film 29 due to the formation of the ITO film 30 on the Ta film 29. Furthermore, the Ti film 40 is not corroded by an etchant (ferric chloride solution) used to etch the ITO film 30.

Therefore, the resistivity at the interface between the Ta film 29 and the Ti film 40 and the resistivity at the interface between the Ti film 40 and the ITO film 30 are less susceptible to the change in the process in comparison with the conventional case. As a result, those interfacial resistivities are low and stable.

The Ti film 40 is not provided in the regions opposite to the opening portions X10, X20, and X30 of the SiN film 42. Therefore, the Ti film 40 is not etched by an etchant (buffer hydrofluoric acid) used in patterning the SiN film 42 being an insulating protection film. As a result, the disappearance of the Ti film 40 by the etchant for the SiN film 42 is avoided. Therefore, the Ta film 29 beneath the Ti film 40, the Ta film 29 being more prone to oxidation than the Ti film 40, is prevented from being exposed. Therefore, it is possible to prevent the surface of the Ta film 29 from being oxidized and thus prevent the electric resistances of the first wirings 96a and the second wirings 96b from increasing. Therefore, according to the present embodiment, the LCD panel 11 can be produced with high yield. Furthermore, the present embodiment can cope with a future attempt at making the image display finer.

Figure 12:
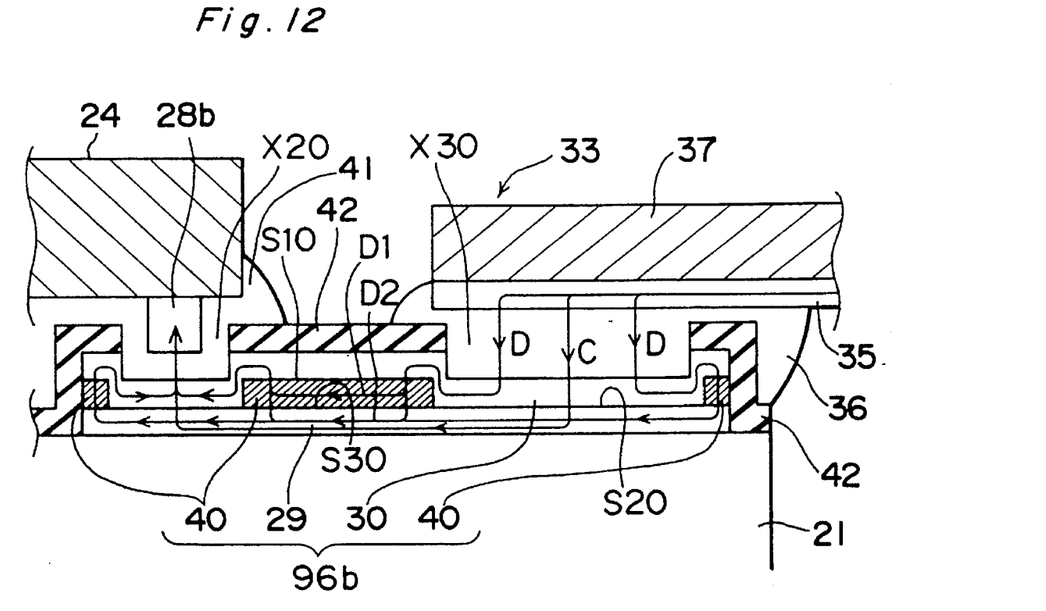
FIG. 12 is an enlarged sectional view of an essential part of FIG. 10.

The following describes the resistance reducing function of the first embodiment based on a case where a current flows from the output terminal 35 of the flexible wiring board 33 to the input-side bump electrode 28b of the drive IC 24 via the second wiring 46b with reference to FIGS. 12 and 13. FIG. 12 shows an enlarged sectional view of the second wiring 96b and its vicinities, and FIG. 13 shows a top view of the second wiring 96b. In FIG. 12 hatching to some parts is omitted for the sake of simplicity.

First, a path C shown in FIG. 12 is the path through which a current flows when the resistivity at the interface between the ITO film 30 and the Ta film 29 of the second wiring 96b is made relatively low within a range of variation. In the present case, the current flowing from the output terminal 35 of the flexible wiring board 33 to the ITO film 30 via the anisotropic conductive film 36 passes through the ITO film 30 which has a sheet resistivity higher than that of the Ta film 29. Then, the current passes through an interface S20 between the ITO film 30 and the Ta film 29, and flows in the Ta film 29 which has a lower sheet resistivity. Then the current flowing in the Ta film 29 passes again through the interface S20 between the Ta film 29 and the ITO film 30 below the input-side bump electrode 28b of the drive IC 24, and then through the ITO film 30 into the input-side bump electrode 28b via the anisotropic conductive film 41.

Meanwhile, a path D shown in FIG. 12 is the path through which a current flows when the resistivity at the interface between the ITO film 30 and the Ta film 29 of the second wiring 96b is made relatively high within the range of variation. In the present case, the current flowing from the output terminal 35 of the flexible wiring board 33 to the ITO film 30 via the anisotropic conductive film 36 does not pass through the interface S20 between the ITO film 30 and the Ta film 29 but flows in the ITO film 30 which has a sheet resistivity higher than that of the Ta film 29. Then the current passes through a region of the ITO film 30 opposite to the opening portion X30 of the SiN film 42, and then passes through an interface S10 between the ITO film 30 and the Ti film 40, and then flows in the Ti film 40 which has a sheet resistivity lower than that of the ITO film 30 or in the Ta film 29 beneath the Ti film 40 as indicated by a path D1 or a path D2 in FIG. 12. The reason for the above is that the Ti film 40 has a sheet resistivity lower than that of the ITO film 30, and the resistivity at the interface S1 between the Ti film 40 and the ITO film 30 is lower than the sheet resistivity at the interface S20 between the Ta film 29 and the ITO film 30. It is to be noted that the resistivity at the interface between the Ti film 40 and the Ta film 29 is lower than the resistivity at the interface S10. Then the aforementioned current passes again through the interface S10 between the ITO film 30 and the Ti film 40 at an end of the Ti film 40 on the side of the input-side bump electrode 28b, and flows through the ITO film 30 and then the anisotropic conductive film 41 into the input-side bump electrode 28b.

In the conventional wiring structure which does not include the Ti film 40, the current path is limited to the path C, and therefore the current cannot help passing through the interface S20 between the ITO film 30 and the Ta film 29 having a resistivity higher than that of the interface S10 between the ITO film 30 and the Ti film 40. In contrast, in this second embodiment, the current can flow through the path D, i.e., a bypass route extending through the interface S10 having a resistivity lower than that of the interface S20. Since the second embodiment has the low-resistance bypass route for the current flow, the second wiring 96b is prevented from having a high resistance as a whole and maintained at a low resistance. This is true with the first wiring 96a. Namely, the resistance of the wiring can be maintained at a value lower than that of the conventional example.

In the first embodiment, since the Ti film 40 of the second firing line 46b is provided only on one side (display area side) of the opening portion X3, the current path from the opening portion X3 to the Ti film 40 runs only in one direction as shown in FIG. 9. In contrast, according to the second embodiment, since the Ti film 40 is surrounding the ITO film 30 opposing the opening portion X30, there are a plurality of different current paths extending from the ITO film 30 to the Ti film 40 around the ITO film 30 as shown in FIG. 13. Furthermore, according to the second embodiment, since the Ti film 40 is provided around the opening portion X20 of the SiN film 42 in the vicinity of the input-side bump electrode 28b, there are a plurality of different current paths directed from the Ti film 40 to the ITO film 30 opposing the opening portion X20, as shown in FIG. 13. As described above, since the Ti film 40 is surrounding the ITO film 30 opposite to the opening portions X20 and X30 in the second embodiment, a plurality of current paths extending in all directions between the Ti film 40 and the ITO film are provided. Therefore, the current density of the current paths can be reduced in comparison with the first embodiment in which the Ti film 40 is not surrounding the ITO film 30. Therefore, the wiring resistance can be further reduced than in the first embodiment.

Actually, the resistivity (including the resistivity at the terminal portion) relevant to the second wiring 96b was 1.5 to 2 Ω when the area of the Ti film 40 was $3 \times 10^4$ μm$^2$. As obvious from this value, the value of the resistivity and the variation of the resistivity in the wiring in the second embodiment were remarkably reduced in comparison not only with the value of 5 to 29 Ω of the conventional wiring without the Ti film but also with the value of the wiring in the first embodiment.

It is to be noted that in the first and second embodiments, the Ta film 29, Ti film 40, ITO film 30, and SiN film 42 are the films constituting not only the first wirings 46a and 96a and the second wirings 46b and 96b but also the display area 23 of the LCD panels 1 and 11. More specifically, the Ta film 29 constitutes a TFT (Thin Film Transistor) gate electrode 302a of the display area 23, the Ti film 40 constitutes a source electrode 307 and a drain electrode 308, the ITO film 30 constitutes an ITO transparent conductive film 309 to be a pixel, and the SiN film 42 constitutes a protection film 310, as shown in FIG. 14.

Therefore, according to the first and second embodiments, the films constituting the display area of the LCD panel are effectively utilized in reducing the resistance of the wirings without causing a cost increase.

Figure 14:
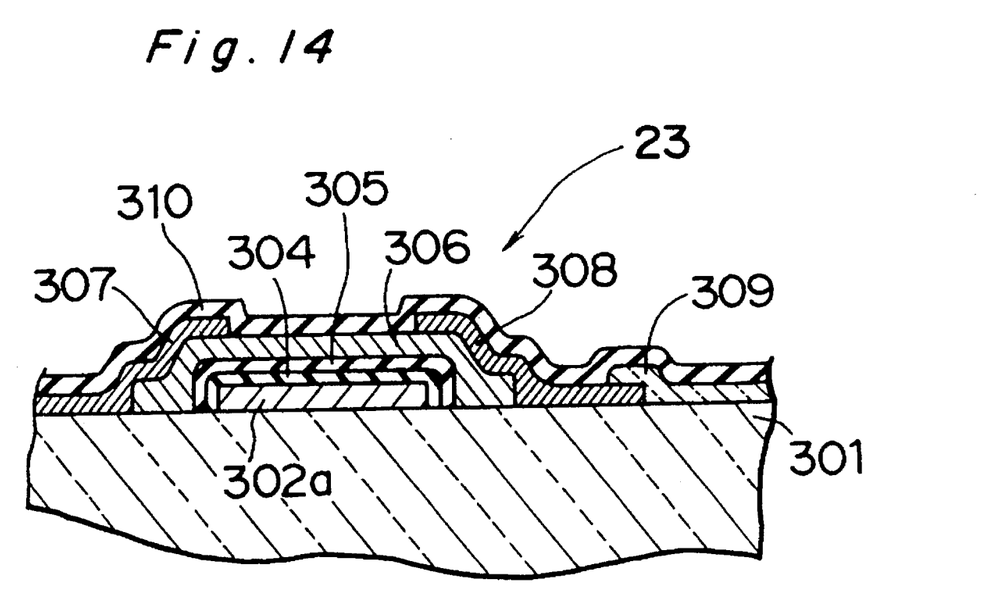
FIG. 14 is a sectional view of a display area of the liquid crystal display devices of the first embodiment and the second embodiment.

The following describes a process of forming the display area 23 of the LCD panel with reference to FIG. 14. First, a Ta film is formed on a glass substrate 301, and thereafter a gate electrode 302a, a gate bus line (not shown), and a lead electrode (not shown) are patterned by photolithography. Thereafter, only the gate electrode 302a required to be anodized is exposed by photolithography, immersed in an ammonium tartrate aqueous solution, and then subjected to a formation process. Then a Ta$_2$O$_3$ film having a thickness of 1000 Å is formed through a formation process at a constant voltage of 6.5 V. As a result, a first insulating film 304 including Ta is formed. On the first insulating film 304 is laminated an Si$_3$N$_4$ film having a thickness of 1000 Å as a second insulating film 305 by the CVD method, sputtering method, or the like. The second insulating film 305 can be made of SiO, SiO$_2$, Y$_{23}$, Al$_2$O$_3$, MgF$_2$, or another material other than Si$_3$N$_4$. The second insulating film 305 has a function of protecting the anodized Ta$_2$O$_3$ film, i.e., the first insulating film 304. The first insulating film 304 and the second insulating film 305 constitute a gate insulating film. Then an amorphous silicon layer is deposited 3000 Å in thickness by glow discharge to be a semiconductor layer 306. Subsequently, Ti is deposited 3000 Å in thickness to be a source electrode 307 and a drain electrode 308. In this way, a TFT (Thin Film Transistor) is completed.

Then an ITO transparent conductive film 309 having a thickness of 300 to 1000 Å is formed to be a pixel. In the TFT, $SiO_3N_4$ is deposited 3000 Å in thickness as a protection film 310 by the CVD method to coat the semiconductor layer 306. The protection film 310 not only protects the amorphous silicon layer but also depletes the surface of the semiconductor layer 306 to reduce the leak current in the off-state of the TFT and thereby remarkably improve the characteristics of the TFT. Finally, the steps of application and orientation processing by rubbing of polyimide resin, sealing, and filling of liquid crystals are performed and an LCD panel is thus completed.

In the display area 23 having the above-mentioned construction, because the gate insulating film includes the first insulating film 304 which is an anodized Ta film, the TFT has the following excellent characteristics:

(1) excellent insulating qualities (having no pin hole), high reliability and high-voltage resistance;

(2) small mobile ion density;

(3) small interface level density with respect to the semiconductor; and (4) large field effects upon the semiconductor.

Furthermore, in the display area, because the source electrode 307 and the drain electrode 308 are formed of Ti, the characteristic change of the TFT (due to intrusion of metal ions into the TFT) during the panel fabrication process can be reduced, so that an increased reliability is achieved.

In the first and second embodiments, the buffer hydrofluoric acid is used as an etchant for the SiN film 42. Therefore the Ti film 40 is not formed in the regions opposite to the opening portions X1, X2 and X3; X10, X20, and X30 of the SiN film 42 so that the buffer hydrofluoric acid does not corrode the Ti film 40.

However, when the etching of the SiN film 42 is performed by, for example, the dry etching method with $SiF_4$ (silicon tetrafluoride) plasma, the Ti film 40 is not corroded by the etching. Therefore, in such a case, it is preferable to form the Ti film 40 over the entire area of the wiring pattern. When this arrangement is adopted, it is possible to maintain the resistance at the terminal portion at the lowest level with respect to variation or scattering of interfacial resistivities at the interface between the ITO film 30 and the Ta film 29 due to change in process.

Furthermore, in the above embodiments, the Ta film is used as the first conductive film and the Ti film is used as the second conductive film in the above embodiments. Alternatively, an alloy film whose main constituent is Ta may be used as the first conductive film and an alloy film whose main constituent is Ti may be used as the second conductive film. Also, as far as the condition that the surface of the second conductive film is less prone to oxidation than that of the first conductive film is satisfied, materials for the first conductive film and the second conductive film can be selected from a group consisting of: Al or alloy including Al as a main constituent; Mo or an alloy including Mo as a main constituent; Cr or an alloy including Cr as a main constituent; W or an alloy including W as a main constituent; and Au or an alloy including Au as a main constituent.

Third Embodiment

Figure 15:
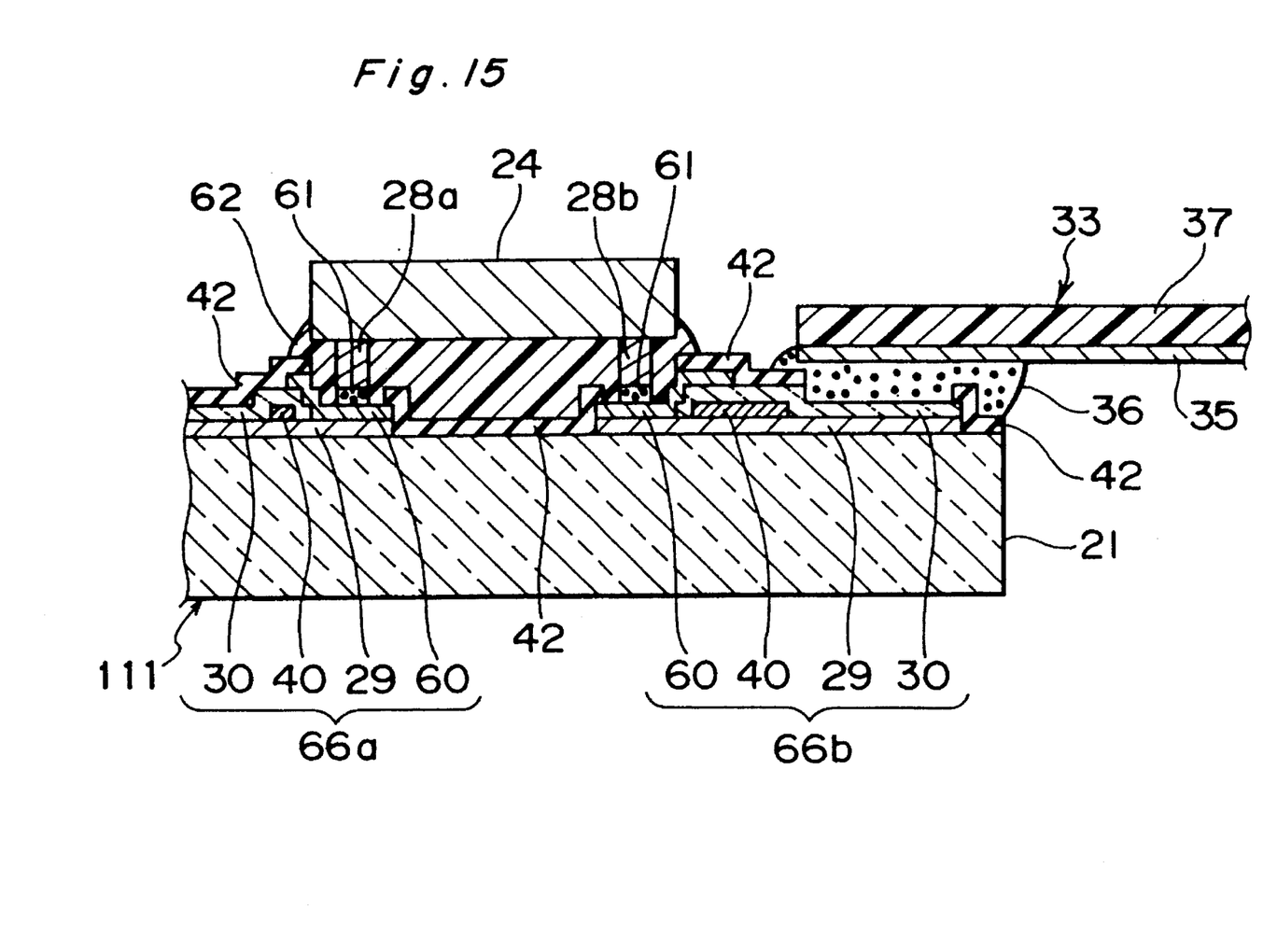
FIG. 15 is a sectional view of essential parts of a liquid crystal display device in accordance with a third embodiment of the present invention.

FIG. 15 shows essential parts of a liquid crystal display device in accordance with a third embodiment of the present invention. Since the plan view thereof is similar to that show in FIG. 5, the plan view of FIG. 5 is used for the description of this embodiment as well. Similar to the liquid crystal display devices of the first and second embodiments, the present liquid crystal display device is assembled by the COG method, and is provided with a LCD panel 111, drive ICs 24, and flexible wiring boards 33. For simplicity, the same components as those shown in FIG. 6 are denoted by the same reference numerals in FIG. 15. Since the drive ICs 24 and the flexible wiring boards 33 are the same as those of the first and second embodiments, no description is provided therefor.

The LCD panel 111 is constructed by sealingly enclosing liquid crystals between a lower substrate 21 as the display board and an upper substrate 22 (see FIG. 5). The lower substrate 21, which embodies the invention, is provided with a plurality of first wirings 66a which extend outwardly from a display area 23 (see FIG. 5) where pixels are formed, toward its peripheral portion. Each of the first wirings 66a has its terminal portion serving as an electrode terminal. On the board periphery side of each first wiring 66a is provided a second wiring 66b which also extends toward the periphery of the board, separately from the first wiring 66a. The patterns of the wirings 66a and 66b each have a two-layer film composed of a Ta film 29 provided in contact with the lower substrate 21 and an ITO film 30 provided on the Ta film 29. At least in a region of the pattern of each of the wirings, a Titanium film 40 is disposed between the Ta film 29 and the ITO film 30. The first wiring 66a and the second wiring 66b respectively include an Mo film 60 formed on the Ta film 29 and the ITO film 30 at a board-periphery-side end portion of the first wiring 66a and at a display-area-side end portion of the second wiring 66b. The Mo film has a sheet resistivity of about 0.5 $\Omega/\square$. An insulating film 42 covers approximately the whole area of the lower substrate 21 except for the terminal portions of the wirings 66a and 66b.

In the process of producing the lower substrate 21, the interfacial resistivity at the interface between the Ta film 29 and the Ti film 40 and the interfacial resistivity at the interface between the Ti film 40 and the ITO film 30 are less susceptible to the change in the process in comparison with the conventional case, so that the interfacial resistivities become low and stable. Therefore, the display boards 111 can be produced with high yield. Furthermore, the display board can cope with a future attempt at making the image display finer. The reason why the Mo film 60 is provided only at the boar-periphery-side terminal portion of the first wiring 66a and the display-area-side terminal portion of the second wiring 66b is that the Mo film has a low moisture resistance and therefore would be corroded by the moisture entering through a gap generated in a stepped portion at the insulating film 42.

In the assembled state shown in FIGS. 5 and 15, the drive IC 24 is mounted between the first wirings 66a and the second wirings 66b of the lower substrate 21. Meanwhile, the flexible wiring board 33 is connected to the wirings 66b. More specifically, the output-side bump electrodes 28a and the input-side bump electrodes 28b of the drive IC 24 are connected respectively to the board-periphery-side terminal portions (electrode terminals) of the wirings 66a and the display-area-side terminal portions of the wirings 66b of the lower substrate 21 via a paste of Ag and Pd 61 (referred to as "Ag/Pd paste") including conductive particles of an alloy of Ag and Pd. Meanwhile, the output terminals 35 of the flexible wiring board 33 are connected to the board-periphery-side terminal portions of the wirings 66b of the lower substrate 21 via an anisotropic conductive film 36. A gap between the drive IC 24 and the lower substrate 21 is filled with a sealing resin 62. The connection by means of the Ag/Pd paste 61 is performed through the steps of transferring an appropriate amount of Ag/Pd paste 61 to the output-side bump electrodes 28a and the input-side bump electrodes 28b of the drive IC 24, placing the drive IC in position, and heating the Ag/Pd paste 61 to harden it. The connection by the anisotropic conductive film 36 is performed through application of heat and pressure.

In operation, an electric power and an input signal are supplied from the output terminals 35 of the flexible wiring board 33 to the drive IC 24 via the connection material 36, the second wirings 66b, the connection material 61, and the input-side bump electrodes 28b of the drive IC 24. Then a display signal output from the drive IC 24 is supplied to the display area 23 via the output-side bump electrodes 28a, the connection material 61, and the first wirings 66a.

Since the Ti film 40 is provided at least in a region of each of the patterns of the wirings 66a and 66b similar to the first embodiment, a resistance (including a resistance at the terminal portion) relevant to the second wiring 66b which extends from the output terminal 35 of the flexible wiring board 33 to the input-side electrode 28b of the drive IC 24 and a resistance (including a resistance at the terminal portion) relevant to the first wiring 66a which extends from the output-side electrode 28a of the drive IC 24 to the display area 23 become low and stable in comparison with the conventional case. Therefore, a good display quality can be obtained. Furthermore, by virtue of the Mo film 60 and the Ag/Pd paste 61, the contact resistances between the board-periphery-side terminal portion of the first wiring 66a and the output-side bump electrode 28a of the drive IC 24 and between the display-area-side terminal portion of the second wiring 66b and the input-side bump electrode 28b of the drive IC 24 can be further reduced in comparison with the first embodiment. Therefore, the resistance (including the resistance at the terminal portion) relevant to the first wiring 66a and the resistance (including the resistance at the terminal portion) relevant to the second wiring 66b can be further reduced in comparison with the first embodiment. Therefore, a better display quality can be obtained, and the reliability of the connections can be increased.

Actually, the wiring resistance (including a resistance at the terminal portion) relevant to the second wiring 66b was 1.5 to 2.5 Ω when the area of the Ti film 40 was about $4 \times 10^4$ μm$^2$. As obvious, the resistance and the variation or scattering of the resistance in the wiring including the Ti film were remarkably reduced in comparison with the value of 2 to 10 Ω in the wiring without the Ti film.

It is noted that the Ti film and the Mo film which are provided inside or on the wirings are ordinarily used for the formation of the display area of the LCD panel, and they are not formed specially only for the implementation of the present invention. Therefore, no cost increase results from the implementation of the present invention.

Although the Ti film 40 is formed only in a region of each wiring pattern due to a restriction in the process in the present embodiment, it is preferable to form the Ti film 40 over the entire area of the wiring pattern when there is no restriction in the process.

Although the liquid crystal display devices assembled in accordance with the COG method are described in the foregoing embodiments, the scope of application of the present invention is of course not limited to this. The present invention can be applied to a liquid crystal display device assembled by a common assembling system (drive IC assembling method). In the above-mentioned case, the resistance of the wiring extending from the output terminal of the flexible wiring board to the display area can be low and stable in comparison with the conventional case, which allows a good display quality to be obtained. The present invention can be extensively applied to any other flat type display device such as an EL display device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A display board which has wirings on a surface thereof for transmitting a signal received from outside at a peripheral portion of the display board to a display area of the display board, wherein each wiring comprises:

a first conductive film formed of a first material and disposed on said surface of said display board;

a second conductive film which is formed of a second material satisfying a condition that a surface of said second conductive film is less prone to oxidation than a surface of said first conductive film and which is disposed on a part of said first conductive film; and a transparent conductive film which is an oxide film and which is disposed on at least said second conductive film, said first conductive film, second conductive film and transparent film constituting a three-layered structure portion of said wiring.

2. The display board as claimed in claim 1, wherein portions of said wirings, inclusive of said three-layered structure portion, other than an end portion serving as an electrode terminal are covered with an insulating protection film.

3. The display board as claimed in claim 2, wherein, at the end portion of each wiring serving as the electrode terminal, said transparent conductive film is formed on said first conductive film.

4. The display board as claimed in claim 3, wherein said second conductive film surrounds the transparent conductive film formed on said first conductive film.

5. The display board as claimed in claim 3, wherein said wirings include first wirings extending outside from the display area toward a periphery of the display board and second wirings provided on a board periphery side of said first wirings and extending toward the periphery of the display board.

6. A display device including the display board as claimed in claim 5, wherein a drive circuit for generating a signal to be transmitted to said display area is provided between said first wirings and said second wirings of the display board, wherein input-side electrodes of the drive circuit are connected with display-area-side end portions of said second wirings and output-side electrodes of the drive circuit are connected with board-periphery-side end portions of said first wirings, and wherein output terminals of a flexible wiring board for supplying a signal to said drive circuit are connected with board-periphery-side end portions of said second wirings.

7. The display device as claimed in claim 6, wherein the transparent conductive film of each of said first and second wirings is an indium tin oxide film, and wherein the indium tin oxide film of each of said first and second wirings is connected to the corresponding electrode of the drive circuit by an anisotropic conductive film.

8. The display board as claimed in claim 1, wherein said first material is Ta or an alloy whose main constituent is Ta, and said second material is Ti or an alloy whose main constituent is Ti.

9. The display board as claimed in claim 8, wherein said transparent conductive film is made of indium tin oxide.

10. The display board as claimed in claim 9, wherein each wiring further comprises a Mo film which is formed on said transparent conductive film included in said three-layered structure portion.

11. The display board as claimed in claim 10, wherein, at an end portion of each wiring serving as an electrode terminal, said Mo film is also formed on said first conductive film.

12. The display board as claimed in claim 11, wherein said wirings include first wirings extending outside from the display area toward a periphery of the display board and second wirings provided on a board periphery side of said first wirings and extending toward the periphery of the display board, and said Mo film is formed at a board-periphery-side end portion of each first wiring and at a display-area-side end portion of each second wiring.

13. A display device including the display board as claimed in claim 12, a drive circuit for generating a signal to be transmitted to said display area is provided between said first wirings and said second wirings of the display board, wherein input-side electrodes of the drive circuit are connected with said display-area-side end portions of said second wirings and output-side electrodes of the drive circuit are connected with said board-periphery-side end portions of said first wirings, and wherein output terminals of a flexible wiring board for supplying a signal to said drive circuit are connected with board-periphery-side end portions of said second wirings.

14. The display device as claimed in claim 13, wherein the Mo film of each of said first and second wirings are connected with the corresponding electrode of the drive circuit by a paste including either Ag or an alloy of Ag and Pd as conductive particles.

15. The display board as claimed in claim 1, wherein said first material and second material are selected from a group consisting of Al or an alloy whose main constituent is Al, Mo or an alloy whose main constituent is Mo, Cr or an alloy whose main constituent is Cr, W or an alloy whose main constituent is W, and Au or an alloy whose main constituent is Au wherein said first material is different from said second material.

16. The display board as claimed in claim 1, wherein said transparent conductive film is made of indium tin oxide.

17. A display device including the display board as claimed in claim 1, wherein said wirings are connected with output terminals of a flexible wiring board mounted with a drive circuit for generating a signal to be transmitted to said display area.

18. A display board which has wirings on a surface thereof for transmitting a signal received from outside at a peripheral portion of the display board to a display area of the display board, wherein each wiring comprises:

a tantalum film formed on said surface of said display board;

a titanium film which is formed on at least a part of said tantalum film; and an indium tin oxide film formed on at least said titanium film.

19. The display board as claimed in claim 18, wherein said indium tin oxide film are also formed on portions of said tantalum film where no titanium film is formed.

20. The display board as claimed in claim 19, wherein an Mo film is formed on said indium tin oxide film at an end portion of each wiring.

* * * * *